United States Patent
Harpak et al.

(10) Patent No.: US 8,219,055 B2
(45) Date of Patent: Jul. 10, 2012

(54) METHOD FOR TUNING AN RF BASE-BAND CIRCUIT OF A RECEIVER

(75) Inventors: Amnon Harpak, Holon (IL); Roy Oren, Magshimim (IL)

(73) Assignee: Siano Mobile Silicon Ltd., Netanya (IL)

( * ) Notice: Subject to any disclaimer, the term of this patent is extended or adjusted under 35 U.S.C. 154(b) by 584 days.

(21) Appl. No.: 11/918,246

(22) PCT Filed: Apr. 6, 2006

(86) PCT No.: PCT/IL2006/000444
§ 371 (c)(1),
(2), (4) Date: Dec. 23, 2008

(87) PCT Pub. No.: WO2006/109296
PCT Pub. Date: Oct. 19, 2006

(65) Prior Publication Data
US 2009/0143034 A1  Jun. 4, 2009

Related U.S. Application Data

(60) Provisional application No. 60/670,706, filed on Apr. 13, 2005.

(51) Int. Cl.
*H04B 17/00* (2006.01)
(52) U.S. Cl. ................... 455/226.1; 455/232.1
(58) Field of Classification Search .............. 455/118, 455/226.1–226.4, 232.1–253.2, 67.11–67.14, 455/296; 375/362, 344
See application file for complete search history.

(56) References Cited

U.S. PATENT DOCUMENTS

| | | | |
|---|---|---|---|
| 6,067,332 A | 5/2000 | Taura et al. | |
| 6,356,217 B1 * | 3/2002 | Tilley et al. | 455/138 |
| 6,567,488 B1 * | 5/2003 | Cowley | 375/344 |
| 7,068,987 B2 * | 6/2006 | Baldwin et al. | 455/232.1 |
| 7,085,587 B2 * | 8/2006 | Oono et al. | 455/253.2 |
| 7,146,146 B2 * | 12/2006 | Masenten et al. | 455/226.1 |
| 7,158,586 B2 * | 1/2007 | Husted | 455/313 |
| 7,702,306 B2 * | 4/2010 | McMullin et al. | 455/67.11 |
| 2002/0177423 A1 | 11/2002 | Cowley | |
| 2006/0068739 A1 * | 3/2006 | Maeda et al. | 455/296 |
| 2009/0082691 A1 * | 3/2009 | Denison et al. | 455/336 |

OTHER PUBLICATIONS

International Search Report dated Apr. 17, 2007 for Application Number: PCT/IL06/00444.

* cited by examiner

*Primary Examiner* — Lana N Le
(74) *Attorney, Agent, or Firm* — Eitan, Mehulal & Sadot

(57) ABSTRACT

A tuner for a wireless receiver is provided, which may include an input interface that is adapted to receive wireless signals, a mixer that is adapted to select a specific frequency from signals received at the input interface, and a controllable switch that is adapted to lead an output from the mixer towards a base-band unit of the receiver and to disconnect the output. The tuner may further include a controller which may be adapted to operate the controllable switch to disconnect the output of the mixer when the controller studies characteristics of the tuner and to reconnect the output of the mixer at other times. The studied characteristics may be associated with parasitic direct current voltages in the tuner, which may be associated with a low noise amplifier of the tuner, or programmable gain amplifier of the tuner or with both amplifiers. The controller may cause a compensation direct current voltage to be generated and applied to the mixer's output based on the ratio between programmed gain and actual/measured gain of the programmable gain amplifier.

23 Claims, 4 Drawing Sheets

METHOD FOR TUNING AN RF BASE-BAND CIRCUIT OF A RECEIVER

CROSS-REFERENCE TO RELATED APPLICATIONS

The present application is a U.S. National Phase of PCT Application No. PCT/IL2006/000444, filed on Apr. 6, 2006, which claims the benefit under 35 U.S.C. 119(e) of U.S. Provisional Application 60/670,706 filed Apr. 13, 2005, the disclosure of which is incorporated herein by reference.

FIELD OF THE DISCLOSURE

The present disclosure relates generally to the field of wireless communications. More specifically, the present disclosure relates to a method for tuning a base-band circuit of a wireless receiver. The present disclosure also relates to a tuner that uses such a method, and systems incorporating such a tuner.

BACKGROUND

A typical wireless receiver consists of a tuner and a demodulator. The tuner may include one or more input amplifier(s) and one or more base-band units. One or more of the base-band units may be a programmable gain amplifier ("PGA"). A PGA is an amplifier whose gain is programmable, which means that its gain value may be programmed to one of several optional values and, thereafter, reprogrammed to any other preferred value.

Traditionally, radio frequency ("RF") tuners wirelessly receive RF signals and convert them into an intermediate frequency ("IF") signal whose carrier frequency is lower enough to be conveniently processed by a digital demodulator. The demodulated data may be forwarded to its destination, for example to a data processor, where the data may be further processed.

Referring now to FIG. 1 (prior art), the number 100 refers to a high-level block diagram of a digital RF receiver and particularly a digital video broadcast handheld ("DVB-H") receiver. An RF signal having a specific frequency may be received at antenna 101 and forwarded to tuner 102. Regardless of the specific frequency to which tuner 102 is tuned, tuner 102 normally forwards a fixed intermediate frequency ("IF") signal to analog-to-digital converter ("ADC") and demodulator 103, where the original information/data is extracted by demodulating the IF signal. The extracted information/data may then be forwarded to where it is needed. For example, the information/data may be forwarded to destination 104, shown at 108, where it may be further processed and/or introduced to a user, such as by being displayed to him.

Typically, each unit in the receiver 100 (for example tuner 102 and ADC & demodulator 103) may be controlled by the following unit (for example, destination 104) to which the receiver 100 forwards its output signal. For example, destination 104 may control ADC & demodulator 103 (shown at path 105) and ADC & demodulator 103 may control tuner 102 (shown at path 106). Ideally, by controlling tuner 102 and ADC & demodulator 103 in the manner described above should ensure that the data or signal each unit receives from its preceding unit is optimized, regardless of parasitic DC voltages that may exist in the tuner and the conditions of the communication channel. In particular, the quality of the signal (shown at 107) forwarded by tuner 102 to demodulator 103 may be critical to the performance of the receiver 100 as a whole.

In recent years, receivers have been designed with a "low-IF" tuner and zero IF ("ZIF"), in which the low frequency IF frequency may be near or at zero, respectively. An advantage of a zero-IF tuner is that there is no need for an additional band pass filter due to the use of a mixer in the IF frequency stage before the RF signal is converted into a base-band signal, which is the analog signal that is fed to an ADC for further processing. Instead, the IF signal in a zero-IF tuner can be applied directly, as is, to an ADC such as ADC 103. Thus, it may be said that the input RF carrier signal in a zero-IF tuner is converted to a base-band signal by using a single conversion step.

Referring now to FIG. 2 (prior art), the number 200 refers to a conventional zero-IF tuner that typically consists of two paths, known as the "I" path (220) and the "Q" path (230). The I path 220 typically includes a Low Pass Filter ("LPF") such as LPF 208, which performs anti-aliasing, by filtering out signals with a frequency higher than the ADC aliasing frequency. In addition, the LPF (LPF 208, for example) filters out signals whose frequency is higher than the maximal frequency in the received frequency band. The Q path (generally shown at 230) is similar to the I path (generally shown at 220), except that LNA 201 output's signal 217 is mixed at mixer 219 with a signal (shown at 218) whose phase is shifted by +90 degrees. More about zero-IF tuners may be found, for example, in "Effective IM2 estimation for two-tone and WCDMA modulated blockers in zero-IF" by Walid Y. Ali-Ahmad, (Apr. 1, 2004), "A CDMA2000 Zero-IF Receiver With Low-Leakage Integrated Front-End" by H. Waite et al. (IEEE JOURNAL OF SOLID-STATE CIRCUITS, VOL. 39, NO. 7, July 2004, pg. 1175-1178), and in "A Multiple-Shape Channel Selection Filter for Multimode Zero-IF Receiver using Capacitor over Active Device Implementation" by Andreia Cathelin et al. (ESSCIRC 2002, page 651).

A traditional zero-IF tuner has various drawbacks. The bandwidth of a zero-IF signal is located in the frequency domain near direct current ("DC"), and there are other parasitic DC sources, which are not related in any way to the zero-IF signal, that may degrade the performance of the tuner. Therefore, the performance of the receiver as a whole may be reduced, as the parasitic DC sources may saturate the tuner's amplifiers and degrade the dynamic range of the ADC as well, depending on the actual parasitic DC voltage.

In order to mitigate the effect of the parasitic DC voltages, a DC cancellation loop is forced, usually by a demodulator such as demodulator 103 of FIG. 1. The purpose of the DC cancellation loop is to provide to a tuner such as 200 a correction DC voltage that will neutralize, or at least compensate for, the detrimental effect of the parasitic DC voltages.

In a traditional tuner, the value of the correction DC voltage is calculated by the demodulator based on intermediate metrics and monitored signal levels. After being set, the demodulator may forward the correction DC voltage to tuner 200. There is a mutual dependency between metrics as measured and calculated by a demodulator such as demodulator 103. In general, metrics may relate to various parameters associated with the receiver, and be used for monitoring and controlling the tuner's functionality. Metrics may relate, for example, to the received signal's energy which may be used to set the tuner's gain. Metrics may also relate to bit error rate ("BER"), error vector magnitude ("EVM"), and to I/Q-mismatch measurements that may be useful for calculating the mutual dependency between the two (I and Q) tuner's outputs (for example outputs 221 and 231 of tuner 200). For optimal reception, the signals corresponding to the I and Q path (for example signals 221 and 231, respectively) have to be orthogonal. The term "I/Q-mismatch" refers to a situation where the I and Q channels are not orthogonal, in which case it may be said that the I and Q path are undesirably mutually dependent. Because DC components look like a mutual dependant component they must be removed before estimation of the I/Q mismatch is performed. For example, a desired change in the PGA gain may result in an undesired change in the DC level, which may detrimentally affect both the energy of the signal as measured after the ADC and I/Q mismatch cancellation.

Referring again to FIG. 2, zero-IF tuner 200 typically includes PGA 209, the output of which is forwarded to an ADC such as ADC 103 in FIG. 1. When a received signal (shown at 216) is relatively weak, the gain of PGA 209 may be (re)programmed to high values. Under such conditions, it may often occur that even a relatively low DC voltage at the input 215 of the PGA 209 would result in a relatively high DC voltage at the output 221 of the PGA 209, which is problematic as far as the ADC functionally is concerned, partly because of the limited dynamic range of the ADC. A high DC voltage at the output 221 of the PGA 209, and therefore at the input of the ADC, such as ADC 103 with input signal 107, would degrade the performance of the ADC. Therefore, it is imperative that the demodulator, for example demodulator 103, forwards a correction DC voltage that cancels out as much of the parasitic DC voltage as possible before it reaches PGA 209.

Every time the gain of PGA 209 is reprogrammed to a new value, the DC level at output 221 of the PGA 209, which depends on the error of the DC correction loop at the PGA input, changes accordingly. However, it may take the demodulator (demodulator 103, for example) thousands of samples to make the necessary measurements and to calculate the new metrics before a new correction DC voltage is decided.

Consequently, a considerable amount of time may lapse before the demodulator finally applies a correction DC voltage (207) to the tuner. Therefore, reprogramming the gain of PGA 209 while demodulator 103 extracts the information/data will degrade the performance of the receiver as a whole because, as variously reasoned hereinbefore, there will be a time period during which a previously, probably unsuitable, correction DC voltage will coexist with a newly programmed PGA gain. In such cases, high DC voltages may still reach input 215 of PGA 209, that is, until the new, and suitable, correction DC voltage $L_{DC}$ is finally applied to tuner 200 (shown at 207).

As stated before, the analog gain of the tuner 200 in changed in response to changes in the parasitic DC voltages and in the characteristics of the communication channel. Changes in the characteristics of the communication channel may occur, for example, due to various environmental changes and/or movement of the receiver relative to the transmitter. Parasitic DC voltages may result from various reasons. For example, parasitic DC voltages may occur due to an unbalanced receiver, specific RF frequency, poor LO-to-RF isolation, which is the isolation between the local frequency oscillator ("LO") and the RF input that may cause self-mixing of the LO, due to temperature changes, and so on.

Referring again to FIG. 2, the overall gain of a zero-IF tuner typically consists of two major gains, the first of which is $G_{LNA}$, which is the gain of the low noise amplifier ("LNA") 201, and the second is $G_{PGA}$, which is the gain of the baseband amplifier PGA 209. $G_{LNA}$, the gain of LNA 201, may be controlled by a gain signal $G_{LNA}$ (shown at 202) that compensates for loss in the input signal level across the operating communication band. The value of $G_{LNA}$ mainly depends on the distance between the transmitter and the receiver and on the existence of transmissions from other broadcasting stations.

Selecting the required communication channel is done by changing the synthesizer's local frequency $F_{LO}$ (shown at 203), which also compensates for drifts in the signal's frequency. Mixer 204 multiplies the output signal of low noise amplifier 201 with the local frequency 203 to generate, thereby, the low-frequency IF signal (at 206) which is actually zero at in ZIF receiver. To DC correction circuit (a summing unit) 205 is fed a correction DC voltage $L_{DC}$ (shown at 207), which is subtracted from the parasitic DC voltage at the output of mixer 204, in order to eliminate, or at least minimize, the effect of the DC offset caused by the parasitic voltages as explained hereinabove. Low pass filter (LPF) 208 filters unwanted signals and noises so as to prevent aliasing in the ADC (not shown).

The gain of PGA 209 is controlled by gain signal $G_{PGA}$ (shown at 210) for compensating for the loss of the specific channel and other losses. By "loss of the specific channel" is meant failing to receive the main, and intended, communication path, in a multi-path situation, due to temporary poor multi-path conditions. $G_{PGA}$ (210) may also be used to adjust the signal's dynamic range to prevent the ADC (not shown) from entering into a saturation state.

Channel selectivity is generally performed by first setting the (local) frequency of the synthesizer $F_{LO}$ (shown at 203) to a frequency such that the mixing of the low noise amplifier (LNA) 201 output signal 217 with $F_{LO}$ will provide the IF signal (at 206). In order to process IF signal 206, IF signal 206 may be first converted to a digital signal. Therefore, an ADC may be used (not shown), which may be similar to ADC 103 of FIG. 1.

SUMMARY

The following embodiments and aspects thereof are described and illustrated in conjunction with systems, tools and methods, which are meant to be exemplary and illustrative, not limiting in scope. In various embodiments, one or more of the above-described problems have been reduced or eliminated, while other embodiments are directed to other advantages or improvements.

The term "studying characteristics of a tuner" refers herein generally to a controller of a tuner that (re) programs, or sets, the gain of one or more amplifiers (LNA or PGA, for example, or both) of the tuner, measures respective actual gain values and calculates the ratio between each programmed, or preset, gain value and its associated actual gain value. The controller may utilize the calculated ratios to generate DC voltages that will compensate for parasitic DC voltages in the tuner.

Preferably, the method for tuning a tuner may include studying characteristics of the tuner during a studying period (s), and utilizing the studied characteristics for controlling the operation of the tuner at periods other than the studying periods. By "studying period" is meant herein time periods during which the receiver does not expect to receive data or information and, therefore, the signal path within the receiver may be broken, such as by disconnecting the output of the tuner's mixer, during such periods.

Additionally, a tuner of a wireless transceiver may include an input interface that may be adapted to receive signals through an antenna and/or an input amplifier of the transceiver. The tuner may also include at least one frequency mixer that may be adapted to select a specific signal from the received signals, and a controllable switch that may be operated to lead an output signal from the mixer towards a baseband unit of the receiver. The switch may, at times, prevent the output signal from reaching the base-band unit.

According to some embodiments, the tuner may include a controller which may be adapted to operate a controllable switch to disconnect the output of the mixer at times and for periods during which the tuner may study the characteristics of the tuner. The controller may then utilize the studied characteristics for controlling the operation of the tuner at periods other than the studying periods.

According to some other embodiments, a tuner of a wireless receiver may include an input interface that is adapted to receive signals through an antenna, at least one mixer that is adapted to extract a specific frequency from the received signals, a programmable gain amplifier (PGA) and a controller. The controller may be adapted to study the characteristics of the tuner and reprogram the PGA periodically, for example, at least once per hour or at least once per minute. According to some other embodiments, the controller may be adapted to cause a DC correction voltage to be provided to a DC correction circuit, which may be coupled to the mixer's output, in accordance with the studied characteristics, for substantially canceling out error DC voltage(s).

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. It is intended that the embodiments and figures disclosed herein are to be considered illustrative, rather than restrictive. The disclosure, however, both as to organization and method of operation, together with objects, features, and advantages thereof, may best be understood by reference to the following detailed description when read with the accompanying figures, in which.

Figure 1:
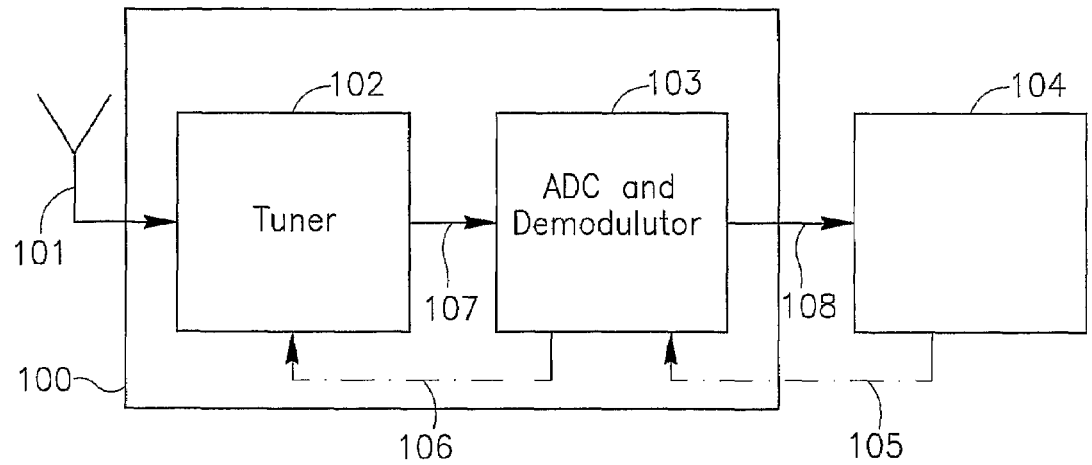
FIG. 1 (prior art) is a block diagram of a DVB-H receiver.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate like elements.

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, components and circuits have not been described in detail so as not to obscure the present disclosure.

Unless specifically stated otherwise, as apparent from the following discussions, it is appreciated that throughout the specification terms such as "processing", "computing", "calculating", "determining", or the like, refer to the action and/or processes which may be performed by or on a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

The disclosure may tale the form of an entirely hardware embodiment, an entirely software embodiment or an embodiment containing both hardware and software elements. In a preferred embodiment, the disclosure is implemented in software, which includes but is not limited to firmware, resident software, microcode, or the like, which may be processed on a microprocessor or microcontroller.

Embodiments of the present disclosure may include apparatuses for performing the operations described herein. This apparatus may be specially constructed for the desired purposes, or it may comprise a general purpose computer selectively activated or reconfigured by a computer program stored in the computer.

The processes presented herein are not inherently related to any particular computer, controller or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present disclosure are not described with reference to any particular programming language. It will be appreciated that a variety of programming languages may be used to implement the teachings of the disclosures as described herein.

As part of the present disclosure, the method for tuning a tuner may include studying characteristics of an amplifier(s) of the tuner during a studying period(s), and utilizing the studied characteristics for controlling the operation of the amplifier(s) at periods other than the studying periods.

As part of the present disclosure, a tuner of a wireless transceiver may include an input interface that may be adapted to receive signals through an antenna and/or an input amplifier of the transceiver. The tuner may also include at least one mixer that may be adapted to extract a signal having a specific frequency from the received signals, and a controllable switch that may be operated to lead an output signal from the mixer(s) towards a base-band unit of the receiver.

According to some embodiments of the present disclosure, the tuner may include a controller which may operate the switch to disconnect the output of the mixer at times and for periods during which the tuner may study the characteristics of an amplifier of the tuner. The controller may then utilize the studied characteristics for controlling the operation of the amplifier at periods other than the studying periods.

According to some other embodiments of the present disclosure, a tuner of a wireless receiver may include an input interface that is adapted to receive signals through an antenna; at least one mixer that is adapted to extract a specific frequency from the received signals; a programmable gain amplifier (PGA); and a controller. The controller may study the characteristics of the tuner and reprogram the amplifier periodically, for example, at least once each hour or at least once each minute.

Figure 2:
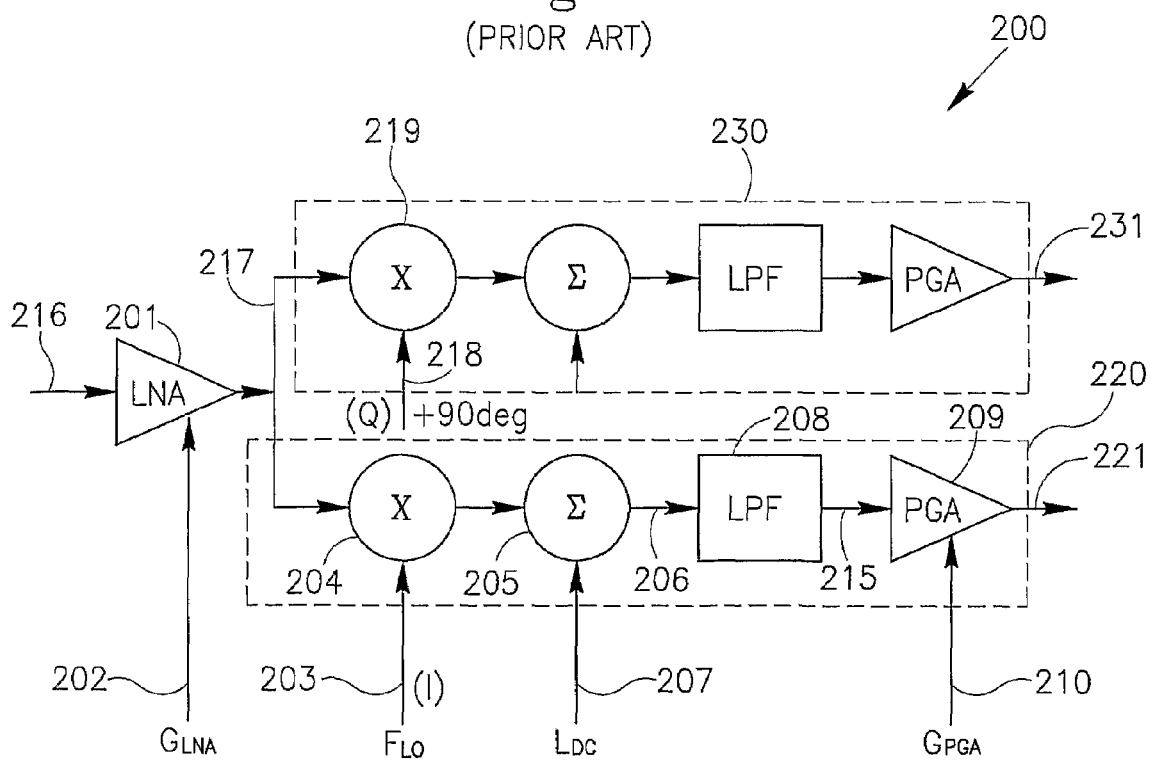
FIG. 2 (prior art) is a schematic diagram showing a partial layout and functionality of the tuner of FIG. 1.
Figure 3:
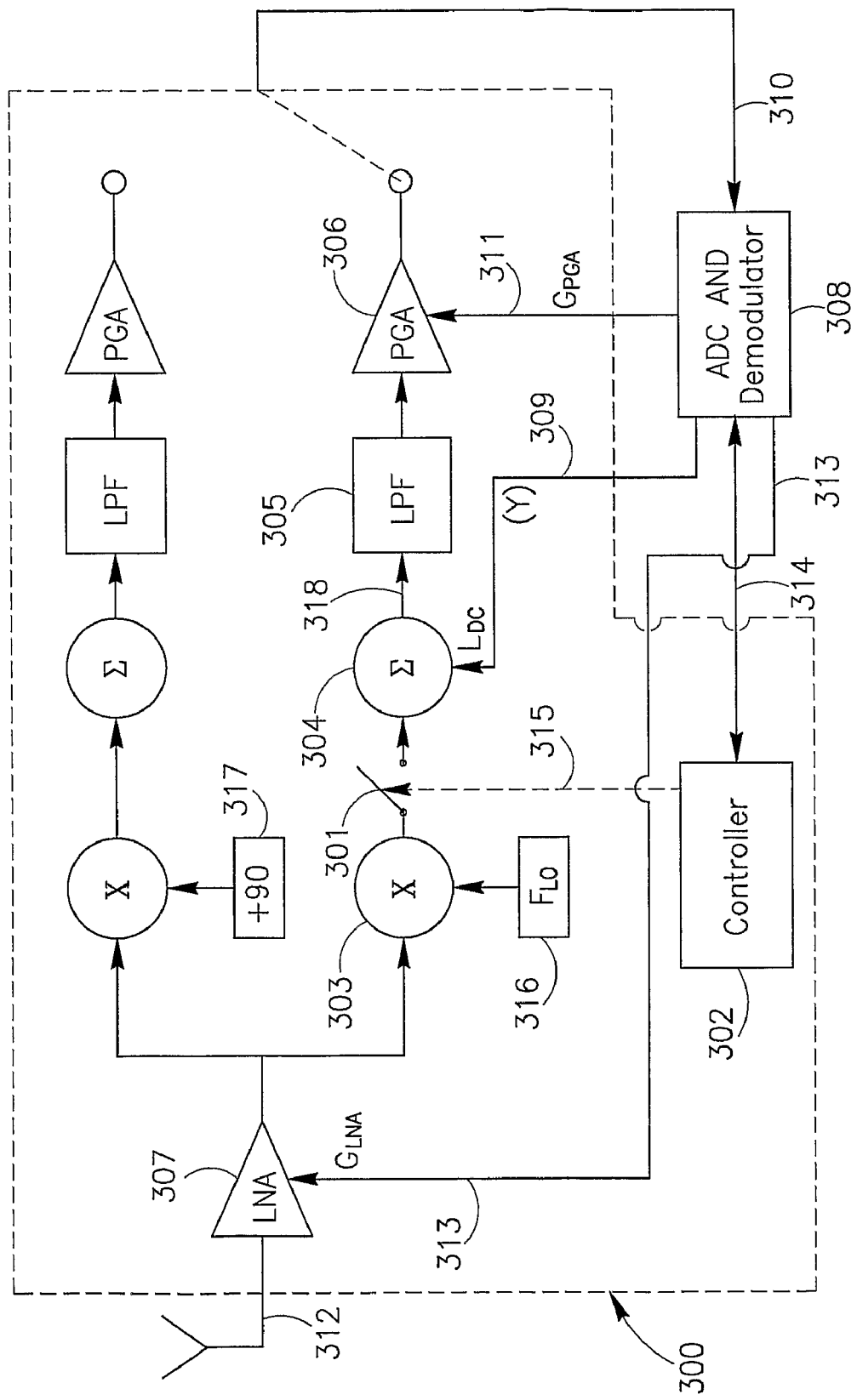
FIG. 3 is a schematic diagram showing a layout and functionality of a preferred tuner.

FIG. 3 shows a schematic partial layout and functionality of a novel tuner 300 according to some embodiments of the present disclosure. Tuner 300 may be similar to tuner 200 of FIG. 2, and/or to tuner 102 of FIG. 1, however, tuner 300 may further include a controllable switch 301 and a controller 302, as further described. Reference numeral 316 refers to a local frequency oscillator $F_{LO}$, and reference numeral 317 refers to a frequency oscillator with substantially the same frequency as $F_{LO}$ but whose phase is shifted by +90° relative to $F_{LO}$.

At the "power-up" stage of a receiver that includes a tuner such as tuner 300, controller 302 may study characteristics of PGA 306 during a studying period(s). Studying the characteristics of PGA 306 may include generation (such as at step 401 of FIG. 4), and thereafter regeneration or update, of a gain calibration table for PGA 306, as described hereinafter. In general, the calibration process (shown at 401 in FIG. 4) may involve finding the actual gain(s) of PGA 306 corresponding to the programmed (theoretical, anticipated or intended) gains. For example, it may occur that a PGA such as PGA 306 is programmed to, and therefore anticipated to, have a preset) gain value of 2.0, whereas the actual gain value of PGA 306 (after programming the gain of PGA 306 to 2.0) may be, for example, 2.2. In traditional tuners, correction DC voltages are determined based on measurements of the level of the DC voltage, which largely depends on the PGA gain because error DC voltages originate at the mixer output and amplified by the PGA. Therefore, unless the entire error DC voltage at the mixer's output is cancelled, changing the gain of the PGA will result in error DC voltage. The error DC voltage may be calculated by using the preset gain value(s) of the PGA, which are often theoretical or based on unique setting of one specific gain at a time. However, the real, or actual, value of the PGA gain(s) differs from the preset value(s), and gain differences (between the programmed/preset and accrual values), for example the difference between 2.0 and 2.2, may result in applying to the traditional tuner a too-low or too-high correction DC voltage, which often degrades the performance of the traditional receiver as a whole. An actual gain value may be found by applying to the input of the PGA 306 (through LPF 305) a known reference DC voltage $L_{DC}$ (shown at 309) and measuring the voltage (at 310) at the output of PGA 306, which is the input voltage of ADC 308.

The calibration process may start by the controller 302 causing (shown at 315) switch 301 to disconnect the output of mixer 303 to isolate the DC path (which includes the DC correction circuit 304, LPF 305 and PGA 306) from the RF section of the tuner (which may include LNA 307 and mixer 303), and, therefore, from interferences originating from the RF section. The source of the interferences may be unwanted RF signals (shown at 312) that may be received at, and amplified by, LNA 307. Controller 302 may concurrently notify (shown at 314) demodulator 308 that it (controller 302) has caused switch 301 to disconnect the output of mixer 301.

Responsive to the latter controller's notification, demodulator 308 may program the gain of PGA 306 to some value, by forwarding to it a corresponding digital control data 311. A short period (a couple of msec., for example) before or after the gain of PGA 306 is programmed, demodulator 308 may forward (shown at 309) a known reference DC voltage ("Y") to DC correction circuit 304. According to some embodiments, demodulator 308 may determine the initial value of the gain of PGA 306 and initial magnitude of the reference DC voltage (Y), and notify (shown at 314) their value to controller 302. According to some other embodiments, controller 302 may determine the initial gain value and initial magnitude of the reference DC voltage (Y) and instruct (shown at 314) demodulator 308 to forward to PGA 306 the digital control data (311) and to DC correction circuit 304 a DC voltage of that magnitude. The actual gain of PGA 306, which may be measured, or expressed, as the ratio between the magnitude of the resulting signal (signal 310 in this example) and the magnitude of reference DC signal (shown at 309), may then be stored in a calibration table such as table-1.

As stated before, the gain of PGA 306 may be programmed to any one of several possible gain values. Accordingly, the calibration process may repeat several times, while, at each time, a respective actual gain is measured for different programmed gains. Each pair of programmed gain and related (corresponding) actual gain may then be stored in the calibration table.

If required or desired, step 401 may also include generation of a gain calibration table for LNA 307, and thereafter regeneration or update, of that gain calibration table. Once the calibration process is completed, controller 302 may decide to initialize (at step 402 in FIG. 4) the gain values of LNA 307 and PGA 306 ($G_{LNA}$ and $G_{PGA}$, respectively). In order to enable the initialization, controller 302 may operate (shown at 315) controllable switch 301 to (re)connect the output of mixer 303 to the input of DC correction circuit 304 for enabling the automatic gain control (AGC) loop of tuner 300. An AGC loop typically includes a circuit that monitors the energy of a received signal, either directly or indirectly, and outputs a correction signal to one or more amplifiers (LNA 307 and/or PGA 306, for example) in the tuner for stabilizing the signal's level at the output of PGA 306. In general, if the monitored signal tends to weaken (or to strengthen), the AGC circuit will output correction signals to increase (or decrease) the amplifiers' gain, so as to compensate for the weakening (or strengthening) signal. In connection with FIG. 3, the AGC loop may include measuring the energy of the signal 310 at the output of PGA 306 and, based on the result of the measurement(s), deciding whether to change the gain of LNA 307 or PGA 306, or both gains, by changing the respective control signal (313 or 311).

In respect of tuner 300, the AGC loop may include measuring in demodulator 308 the energy of a signal that is derived from a complex RF signal that is received at the input 312 of tuner 300. AGC loop of tuner 300 may also include setting an initial value for the overall gain of tuner 300 ($G_{LNA}*G_{PGA}$) in response to the level or energy of the measured signal. Setting the overall gain of tuner 300 may involve forwarding from demodulator 308 control signals 313 and 311, which correspond to the measured signal, to set the values of $G_{LNA}$ (shown at 313) and $G_{PGA}$ (shown at 311), respectively. As will be appreciated by a person skilled in the art, the value of $G_{LNA}$ is preferably maximized, provided that its maximal value is such that LNA 307 still operates linearly and the maximal value is yet smaller than the value of the overall gain of tuner 300. The complex RF signal received at the input 312 may consist of one or more RF signals that are not necessarily intended for tuner 300. Nevertheless, such a complex RF signal may be useful as it may give tuner 300 an indication as to possible initial values for $G_{LNA}$ and $G_{PGA}$. It is assumed that no information/data is intended to be received at tuner 300 at the initialization stage.

During initialization step 402 (in FIG. 4), $G_{LNA}$ (shown at 313 in FIG. 3) remains substantially constant and, consequently, so does the DC voltage (Mdc) at the output of mixer 303. During initialization step 402, demodulator 308 may set an initial offset DC voltage (Y) and apply it (shown at 309) to DC correction circuit 304 in response to the signal being measured in demodulator 308. Any error signal 318 (Error–Mdc–y) will be amplified by PGA 306 and cancelled by demodulator 308 by changing the value of the initial offset DC voltage (shown at 309). Initialization step 402 may be considered completed after the initial values of $G_{LNA}$ (at 313), $G_{PGA}$ (shown at 311) and Y (shown at 309) are determined and applied to LNA 307, PGA 306 and DC correction circuit 304, respectively.

Figure 4:
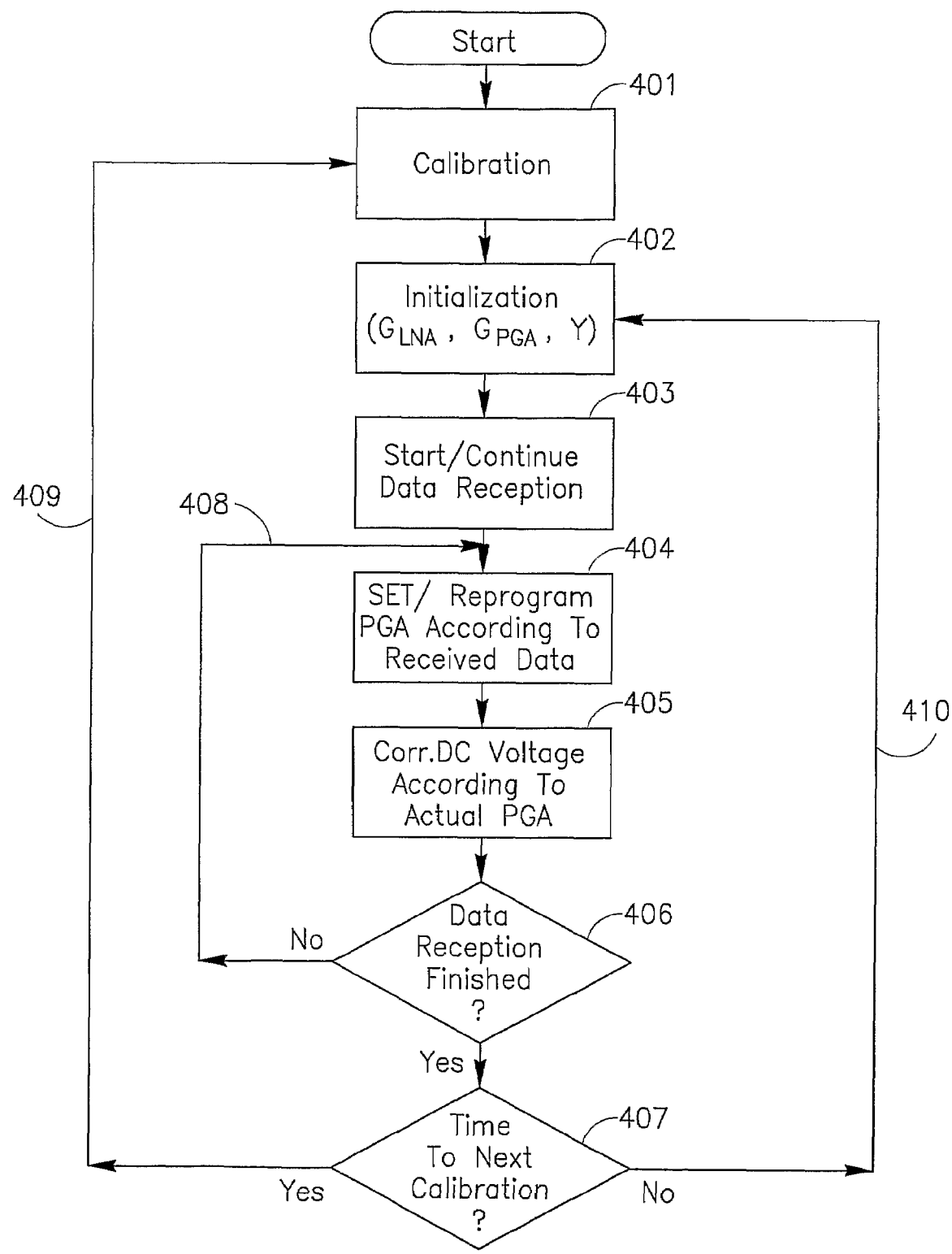
FIG. 4 is a flow chart of a preferred method for calibration.

Once the initialization process referred to by step 402 in FIG. 4 is completed, reception of data/information may start (at step 403 in FIG. 4), during which period the gain $G_{LNA}$ (shown at 313 in FIG. 3) of LNA 307 may remain constant and demodulator 308 may monitor the energy of output signal 310. At times, it may be necessary to reprogram PGA 306; that is, depending on the energy of the signal at 310 that is monitored during step 403 of FIG. 4. In such a case, demodulator 308 may notify controller 302 (shown at 314 in FIG. 3) that demodulator 308 is going to reprogram the gain $G_{PGA}$ (shown at 311) of PGA 306 from some current value to a new value (as described in connection with step 404 of FIG. 4). Responsive to the latter notification, controller 302 may search in the calibration table for a corresponding actual gain value and calculate thereby (at step 405 of FIG. 4) a new correction DC voltage $L_{DC}$ (shown at 309) appropriate for the newly programmed gain $G_{PGA}$. Then, controller 302 may notify (shown at 314) demodulator 308 the new correction DC voltage $L_{DC}$ (shown at 309). Demodulator 308 may then forward (shown at 309) the new correction DC voltage $L_{DC}$ to DC correction circuit 304, to substantially cancel out errors (DC offset voltages) caused by, or resulting from, the difference between the programmed (preset) and actual gain values ($G_{PGA}$).

The way the calibration table is used to find the new correction DC voltage and the benefits of its use will be now exemplified. If actual gains ($G_{PGA}$) were identical to the respective programmable gains, then the correction DC voltage could have been found directly and accurately, simply by calculating the ratio between two corresponding programmed gains. For example, if the initial programmed value for $G_{PGA}$ is 10.0 and the value for $G_{PGA}$ should be set, for example, to a new value, for example to 20.0, then the new correction DC voltage corresponding to the new gain (20.0) can be found by multiplying the initial correction DC voltage by 2.0 (20.0/10.0). For example, if the residual DC error at the output 318 of DC correction circuit 304, and therefore at the input of PGA 306, is 1 mV, it will be ten times larger (10 mV) at the demodulator input (shown at 310) before the gain $G_{PGA}$ of PGA 306 changes, and expected to be 20 mV after the change occurs.

However, since programmable gains and their related actual gains are rarely identical, if at all, the actual ratios between actual gains usually differ from the programmed ratios. Following that notion, if the actual initial gain is, for example, 9.5 (instead of the programmed, theoretical or intended, value 10.0 specified earlier) and the new actual gain is 21 (instead of the programmed, theoretical or intended, value 20.0), then the actual ratio in this case would be 21/9.5=2.21, which differs from the calculated, or theoretical or intended, value 2.0 (20.0/10.0=2.0). Therefore, the actual new correction DC voltage ($L_{DC}$) appropriate for the newly programmed gain ($G_{PGA}$=20.0) of PGA 306, in this example, should be 2.21×10 mV=22.10 mV, and not the calculated value (20 mV). Accordingly, if the value of the gain $G_{PGA}$ of PGA 306 is reprogrammed from 10.0 to 20.0 and the new correction DC voltage ($L_{DC}$) is changed from the initial value 10 mV to 20 mV (instead of 22.1), then the residual (unexpected) error DC signal will be (according to this example) 2.10 mV (22.10−20.0). After being amplified by PGA 306, this unexpected DC error signal (2.10 mV) will not be compensated (because the output of PGA 306 is expected to be 20 mV and not 22.1 mV). If the average level of the signal at 318 has a value other than zero, it means that a DC error exists. For demonstrating the problem, it is assumed that the signal to be evaluated is V. If there is no DC error signal, the average energy level of V may be expressed by $\Sigma V^2$. However, if V includes a DC error signal of magnitude (V is biased by m), then $E(V+m)^2 = E(V^2) + E(2V*m) + E(m^2)$, where B is a mean function and $E(m^2)$ is an undesired DC error component. Now, if the voltage full-scale of ADC 308 is, for example, 500 mV, which may, for example, correspond to a digital value of 1024, the relatively small error of 2.21 mV (m in $\Sigma m^2$) will be translated by ADC 308 to a digital number 5 (2.21/500*1024=4.52≅5). If the AGC will try to set the value of the signal (for example signal 310 in FIG. 3) to 100 mV RMS (root mean square), for example, a 5%—error will be introduced due to the gain setting. The same type, or magnitude of, error will be expected when measuring the I/Q mismatch I and Q are said to match if the average level which results from their product I*Q is zero. If both I and Q have a DC level, m1 and m2 (respectively), the resulting average level will be m1*m2 and, therefore, the I/Q mismatch adaptive correction loop will try to cope with changes in m1 and/or m2.

If data reception continues (at step 406 of FIG. 4), demodulator 308 may decide (shown at 408), based on the signal's (shown at 310) monitored energy, to reprogram PGA 306 (at step 404 of FIG. 4), in which case controller 302 may find in the calibration table a new corresponding actual gain value and translate it into a new correction DC voltage in the way exemplified hereinbefore. If, however, data reception stops and not resumed for a relatively long time, then controller 302 may decide (at step 407) whether the time to the next calibration process has arrived. If the time to the next calibration process has arrived, then controller 302 may decide to return (shown at 409) to step 401 to perform an additional calibration process, for (re)adjusting PGA 306 (and the tuner as a whole) to changes that may occur in the tuner's DC conditions. The tuner's DC conditions may change as a result of changes in temperature or changes in temperature coefficients that are associated with elements constituting the tuner 300. Controller 302 may decide when to initiate a calibration process and initialization process (steps 409 and 410, respectively). In general, a calibration and/or initialization process may be initiated during periods when no data is transmitted to tuner 300.

Currently, there are devices capable of receiving TV broadcasts that conform to mobile digital video broadcast handheld ("DVB-H") standards. DVB-H standard utilizes a feature known in the art as "time-slicing". In general, time slicing involves sending data in bursts by using significantly higher instantaneous bit rate compared to the bit rate required if the data were transmitted using traditional streaming mechanisms. Using time slicing allows inactivating (shutting-down) one or more units in the receiver for a considerable amount of time, which may result in a power saving of up to 90% in some cases.

Figure 5:
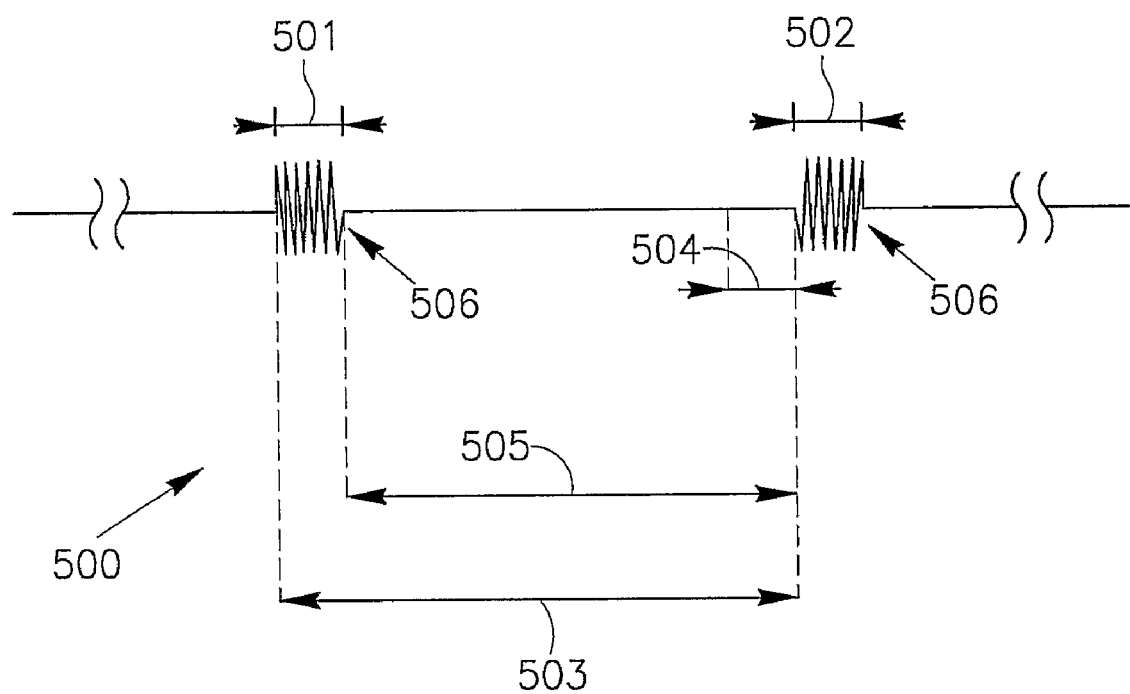
FIG. 5 is a representation of an exemplary signal that includes bursting data.

FIG. 5 is a general representation of an exemplary signal that includes bursting data. More specifically, FIG. 5 shows an exemplary time-sliced signal that characterizes DVB-H type communications, for example. Exemplary signal 500 is shown consisting of two data bursts, 501 and 502, which are carried by a high-frequency RF carrier 506. The data periods 501 and 502, and interval 503 conform to the DVB-H standard. For example, interval 503 may be ten seconds wide and data periods 501 and 502 may be one second wide. As part of the DVB-H standard, each data burst that is received at the receiver notifies the receiver of the instant at which the next data burst is due. For example, data burst 501 may notify the receiver that the next data burst (data burst 502, in this example) is due after specified time period 505. Such notifications allow the receiver to adjust to various changes in the reception conditions, as described herein.

Turning again to FIG. 4, the calibration step 401 and/or initialization step 402 may be performed at any instant during idle period 505, during which idle period no data is expected to be received. Period 505 is relatively short (its length is several milliseconds-msec.). Therefore, the probability that the characteristics of the communication channel will significantly change during such a short time period is relatively low. Therefore, calibration results may be valid for a relatively long time, for example for one or more hours. Calibration step 401 may be performed and repeated depending on conditions of the communication channel and/or temperature and/or temperature coefficients changes. For example, if there is a big temperature difference between morning and evening hours, then it may be beneficial to perform at least one calibration process in the morning(s) and one calibration process in the evening(s).

The initialization step 402, on the other hand, may preferably take place during a short period that precedes each data burst. For example, initialization step 402 may take place during period 504 (referred to herein as "initialization period"), which precedes data bursts such as data burst 502. Accordingly, initial values for $G_{LNA}$ (shown at 313 in FIG. 3), $G_{PGA}$ (shown at 311 in FIG. 3) and for the correction DC voltage (shown at 309 in FIG. 3) may be set, or applied to LNA 307, PGA 306 and to DC correction circuit 304 (respectively) during initialization period 504. Preferably, the value of $G_{LNA}$ (shown at 313 in FIG. 3) may be determined as close as possible to the reception of data burst 502 and it primarily depends on the characteristics of the communication channel which will not likely to change much during the reception of data burst 502. Therefore, $G_{LNA}$ (shown at 313 in FIG. 3) may remain constant during the reception of the entire data burst 502. Since the value of $G_{LNA}$ (shown at 313 in FIG. 3) is typically chosen to be maximal, with the limitations set forth before, and the value of $G_{PGA}$ (shown at 311 in FIG. 3) is, therefore, chosen to be minimal, it may be said that $G_{LNA}$ (shown at 313 in FIG. 3) and $G_{PGA}$ (shown at 311 in FIG. 3) may be regarded as "coarse" and "fine" tunings respectively, of tuner 300 of FIG. 3. By keeping $G_{LNA}$ (shown at 313 in FIG. 3) substantially constant during the reception of an entire data burst, only minor changes may be required in the value of $G_{PGA}$ (shown at 311 in FIG. 3) during the reception of the data burst.

When a data burst such as data burst 502 is received, modulator 308 of FIG. 3 may monitor the signal's energy and, if required, the modulator 308 may reprogram the gain value $G_{PGA}$ (shown at 311 in FIG. 3) of PGA 306 and concurrently determine the value of, and forward to the tuner 300, the correction DC voltage (shown at 309 in FIG. 3) suitable for the newly programmed $G_{PGA}$. Modulator 308 of FIG. 3 may monitor the signal's energy and reprogram $G_{PGA}$ without having to spend time in calculating metrics, as done in traditional tuners. In other words, the newly programmed $G_{PGA}$ (shown at 311) and related correction DC voltage (shown at 309) may be forwarded to the tuner 300 substantially at the same time. This way, the tuner 300 may be smoothly adjusted to accommodate for changes in reception conditions, that is, the tuner 300 may be adjusted without having the adjustment stage interfering with the smooth reception and processing of the data contained in the data burst.

In orthogonal frequency division multiplexing ("OFDM") type signals, a guard interval is inserted in the time domain as a preamble of the symbol (information) data in order to mitigate interferences caused by the delay spread of the channel. The data transmitted during the guard interval period is the cyclic prefix of the symbol. In the receiver, the content of guard intervals is ignored (in the time domain) and signal that is received during the active symbol period (the period during which data or information is conveyed) is processed by the receiver and transformed to the frequency domain in order to extract the received data or information. More information about OFDM, guard interval and cyclic prefix may be found in "Basic of Orthogonal Frequency Division Multiplexing (OFDM)" (from Greg DesBrisay, © 2000 Cisco Systems, Inc.), "Orthogonal frequency-division multiplexing" (by wikipedia, website: en.wikipedia.org/wiki/Orthogonal_frequency-division_multiplexing), and in U.S. provisional patent application No. 60/668,581 from the same applicant (s), filed in Apr. 6, 2005 and titled "A circuit and method for OFDM-based receiver", the content of them all is incorporated herein by reference. According to some embodiments, $G_{PGA}$ (shown at 311 in FIG. 3) may be reprogrammed during the cyclic prefix of the received signals.

Since the content of each guard interval is ignored or discarded by the receiver, guard intervals may be utilized by tuner 300 of FIG. 3 to set new gain values $G_{LNA}$ (shown at 313) and $G_{PGA}$ (shown at 311), for LNA 307 and/or PGA 306 of FIG. 3. Alternatively or additionally, characteristics of the tuner, LNA 307 and/or PGA 306 may be studied by controller 302 of FIG. 3 during guard intervals. Alternatively or additionally, DC correction voltages $L_{DC}$ (shown at 309) may be applied to the DC correction circuit 304 of FIG. 3 during guard intervals.

Many RF applications include transceivers. A transceiver is an apparatus that includes a transmitter and receiver housed together in a single unit which may have some circuits in common. Exemplary apparatuses are wireless LAN ("WLAN") and cellular phones. In such applications, the transmitter may be configured to forward to the receiver a reference signal in the form of a single frequency tone that is adapted for calibration. This tone may be transmitted by the transmitter when the transmitter does not transmit other data or information and the transmitter's local oscillator is tuned to a frequency that is substantially the same as the frequency of the receiver's local oscillator, with known frequency difference. In such cases, the entire RF and base-band path, from input 312 of LNA 307 to the output 310 of PGA 306 can be calibrated. Optionally, whenever a receiver is involved and there is no transmitter at all (in this case the "transceiver" is only a receiver), the DC offset correction signal (shown at 309 in FIG. 3) may be used as a reference signal for studying characteristics of the tuner's amplifiers, for example the characteristics of s PGA 306 of FIG. 3.

In some embodiments of the disclosure, in order to use the DC cancellation loop for calibration, the output of mixer 303 of FIG. 3, is disconnected (such as by opening controllable switch 301 by controller 302) from the base-band input and therefore the input of PGA 306 of FIG. 3 is fully controlled (shown at 311 in FIG. 3) by demodulator 308 of FIG. 3 and a precise calibration may be performed. In some other embodiments which include receiver and transmitter in the same apparatus, the entire, or overall, tuner's gain ($G_{LNA}*G_{PGA}$) can be calibrated without disconnecting the mixer's output. Instead, the entire tuner's overall gain may be calibrated by setting the DC correction value (shown at 309 in FIG. 3) to zero.

The calibration mechanism disclosed herein has the following advantages: (i) Calibration accuracy is very high because the generation of the reference DC voltage and the measurement itself are implemented digitally; (ii) Calibration may be performed once in a while in order to compensate for temperature changes: (iii) It eliminates the need for additional analog signal source; (iv) It fits well to hand-held receivers operating in low duty cycle.

The method and tuner disclosed herein improve the performance of the receiver by enabling smooth gain tracking in the tuner, while significantly reducing transient effects and temporal error bursts that normally exist in traditional tuners during the time it takes the other loops (AGC and I/Q mismatch) to settle (reach their steady state). Temporal errors are specifically expected whenever the Signal-to-Noise ("SNR") ratio is small. In addition, no extra hardware or circuits are needed to implement this disclosure, except the controllable switch used to disconnect the mixer's output from the baseband input Table 1 summarizes the operations described hereinbefore.

TABLE 1

| When | What | Results | Explanation |
| --- | --- | --- | --- |
| At power up | (1) Disconnect Mixer;<br>(2) Set Reference signal;<br>(3) Set all combination of PGA; and<br>(4) Measure actual gain. | Actual gain table for PGA P[a].<br>Real gain = P [nominal gain] | Calibration of PGA gain at start up |
| Reception acquisition | (1) Run AGC algorithm;<br>(2) Set LNA gain<br>Set PGA gain (G1);<br>(3) Run DC cancellation algorithm;<br>(4) Set Analog DC value (Y); and Set digital DC. value (Z1) | Gain of LNA for the entire reception band.<br>Initial gain of PGA to be tracked during data extraction.<br>Analog DC error for the entire reception. E = Mdc − Y | Reception is for short time (during data burst). LNA gain is fixed so DC at the output of the Mixer is fixed (Mdc). The DC cancellation loop will increase the DC level at the input to the PGA by Y. An error DC signal E will remain to be amplified by the PGA (G1) and cancel digitally after ADC. |
| Data extraction | (1) Track signal level;<br>(2) Set PGA new gain (G2); and<br>(3) Cancel DC according to calibration. | Gain is changed with no implication on DC cancellation loop and no temporary errors. | A = P(G2)/P(G1) is the change of gain.<br>Z2 = A*Z1 is the new DC value.<br>In general, after step n during same reception:<br>An = P(Gn)/P(G1)<br>Zn = An*Z1. |
| No reception. Once in a while | Same as power up. | Same as power up. | Calibration of PGA to compensate for temperature change |

While certain features of the disclosure have been illustrated and described herein, many modifications, substitutions, changes, and equivalents will now occur to those skilled in the art. It is, therefore, to be understood that the appended claims are intended to cover all such modifications and changes as fall within the true spirit of the disclosure.

What is claimed is:

1. A tuner for a wireless receiver, comprising:
an input interface adapted to receive wireless signals;
a mixer adapted to select a specific frequency from signals received at said input interface;
a controllable switch adapted to lead an output from said mixer towards a base-band unit of said tuner and to intermittently disconnect said output from the base-band unit;
a direct current (DC) correction circuit coupled to said base-band unit; and
a controller adapted to intermittently characterize one or more signal transfer characteristics of said base-band unit by causing a demodulator to apply a predefined signal to said DC correction circuit, and to measure an output of said base-band unit, while the mixer output is disconnected from the base-band unit, and wherein said controller is further adapted to set one or more tuner parameters based on the characterization.

2. A tuner according to claim 1, wherein the tuner has more than one mixer.

3. A tuner according to claim 1, wherein said controller operates the controllable switch to disconnect the output of the mixer when characteristics of the tuner are studied.

4. A tuner according to claim 3, wherein at least some of the characterizations are associated with parasitic direct current voltages in the tuner.

5. A tuner according to claim 3, wherein at least some of the characterizations are associated with a programmable gain amplifier.

6. A tuner according to claim 5, wherein at least some of the characterizations involve generation of a calibration table by programming amplification values for the programmable gain amplifier and measuring respective actual amplification values.

7. A tuner according to claim 6, wherein the controller causes a compensation direct current voltage to be generated and applied to the mixer when the output of said mixer is reconnected, said compensation direct current voltage is derived from the set and related measured amplification values.

8. A tuner according to claim 3, wherein the controller causes a compensation direct current voltage to be generated and applied to the mixer when the output of said mixer is reconnected, said compensation direct current voltage is derived from the set and related measured amplification values.

9. A tuner of a wireless receiver, comprising:
an input interface adapted to receive wireless signals;
a mixer adapted to select a specific frequency from said signals;
a programmable gain amplifier;
a direct current (DC) correction circuit coupled to a base-band-unit; and
a controller adapted to study the characteristics of the tuner and to periodically reprogram a gain of said amplifier, wherein said studying includes causing output of said mixer to be disconnected from said base-band unit and during the disconnection causing a demodulator to apply a predefined signal to said DC correction circuit to measure an output of said base-band unit.

10. A tuner according to claim 9, wherein periodically is at least once per hour.

11. A tuner according to claim 9, wherein periodically is at least once per minute.

12. A tuner according to claim 9, wherein the tuner has more than one mixer.

13. A tuner according to claim 9, further comprising a controllable switch for disconnecting the output of the mixer when the controller studies the characteristics.

14. A tuner according to claim 13, wherein the controller is adapted to control the controllable switch.

15. A tuner according to claim 13, wherein the controller causes an initial compensation direct current voltage, derived from the programmed amplification value, to be generated and applied to a DC correction circuit, coupled to the mixer output, and wherein said compensation direct current voltage is adjusted based on the programmed amplification value and its related measured amplification value when said output is reconnected to said DC correction circuit.

16. A tuner according to claim 9, wherein the characteristics are associated with parasitic direct current voltages in the tuner.

17. A tuner according to claim 9, further comprising a low noise amplifier wherein said characteristics are associated with said low noise amplifier.

18. A tuner according to claim 9, wherein the characteristics are associated with a programmable gain amplifier.

19. A tuner according to claim 18, wherein studying the characteristics comprises programming amplification values for the programmable gain amplifier and measuring respective actual amplification values.

20. A tuner according claim 19, wherein the controller reprograms the gain of the programmable gain amplifier during a guard interval.

21. A method of tuning a tuner of a wireless receiver having an input interface adapted to receive wireless signals, a mixer adapted to select a specific frequency from received signals, a programmable gain amplifier, a direct current (DC) correction circuit for supplying known reference DC voltages, a demodulator and a controller configured to study the characteristics of the tuner and periodically reprogram the amplification of said amplifier, said method comprising:

placing the tuner into a study mode such that an output of the mixer is disconnected from a base-band unit;

studying characteristics of said tuner by said controller by (1) causing said demodulator to apply a predefined signal to said DC correction circuit and (2) programming said programmable gain amplifier and measuring respective actual amplification values; and reprogramming said programmable gain amplifier responsive to the studied characteristics.

22. A method of compensating for parasitic direct current voltages in a tuner of a wireless receiver having an input interface adapted to receive wireless signals, a mixer adapted to select a specific frequency from received signals, a programmable gain amplifier, a direct current (DC) correction circuit for supplying known reference DC voltages, a demodulator and a controller configured to study the characteristics of the tuner and periodically reprogram the amplification of said amplifier, said method comprising:

placing the tuner into a study mode such that an output of the mixer is disconnected from a base-band unit;

studying characteristics of said tuner by said controller by programming said programmable gain amplifier and measuring respective actual gain values; and providing via the demodulator a compensation direct current voltage to the said DC correction circuit according to the ratio between a gain set for said programmable gain amplifier and a corresponding actual measured gain at the output of the base-band unit.

23. A tuner of a wireless receiver, comprising:
an input interface adapted to receive wireless signals;
a low noise amplifier, coupled to said input interface;
a mixer coupled to said low noise amplifier and to a DC correction circuit and adapted to select a specific frequency from said wireless signals;
a programmable gain amplifier; and
a controller adapted to select actual gain values for said low noise amplifier and said programmable gain amplifier in accordance with characterization preformed on one or more tuner elements during a study mode when an output of the mixer is disconnected from a base-band unit, a demodulator is caused to apply a predefined signal to said DC correction circuit, and said controller is further adapted to alter a gain value of said programmable gain amplifier.

* * * * *